(12) United States Patent
Dogome et al.

(10) Patent No.: US 12,080,572 B2
(45) Date of Patent: Sep. 3, 2024

(54) SUBSTRATE PROCESSING APPARATUS (71) Applicant: TOKYO ELECTRON LIMITED, Tokyo (JP)

(72) Inventors: Masahiro Dogome, Miyagi (JP); Masatomo Kita, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 91 days.

(21) Appl. No.: 17/563,906

(22) Filed: Dec. 28, 2021

(65) Prior Publication Data
US 2022/0208576 A1 Jun. 30, 2022

(30) Foreign Application Priority Data

Dec. 28, 2020 (JP) ................................. 2020-219021

(51) Int. Cl.
*H01L 21/67* (2006.01)
*C23C 16/44* (2006.01)
*C23C 16/455* (2006.01)

(52) U.S. Cl.
CPC .... *H01L 21/67201* (2013.01); *C23C 16/4412* (2013.01); *C23C 16/45519* (2013.01); *H01L 21/67167* (2013.01)

(58) Field of Classification Search
None
See application file for complete search history.

(56) References Cited

U.S. PATENT DOCUMENTS

| | | | | |
|---|---|---|---|---|
| 5,695,564 A | * | 12/1997 | Imahashi | .......... H01L 21/67161 414/217 |
| 5,934,856 A | * | 8/1999 | Asakawa | ................ F16K 51/02 414/217 |
| 2008/0274288 A1 | * | 11/2008 | Kondo | ................ C23C 16/4408 427/294 |
| 2015/0082625 A1 | * | 3/2015 | Rice | .................. H01L 21/67196 29/742 |
| 2017/0117170 A1 | * | 4/2017 | Wong | ................ H01L 21/67303 |
| 2020/0407179 A1 | * | 12/2020 | Kim | ....................... B65G 54/02 |

(Continued)

FOREIGN PATENT DOCUMENTS

| | | |
|---|---|---|
| JP | 2009-267012 A | 11/2009 |
| JP | 2011-054933 A | 3/2011 |

(Continued)

*Primary Examiner* — Karla A Moore
(74) *Attorney, Agent, or Firm* — XSENSUS LLP (57) ABSTRACT

A substrate processing apparatus includes one or more substrate processing modules; a vacuum transfer module connected to the one or more substrate processing modules; and a load-lock module including at least three load-lock chambers arranged along a first horizontal direction. A tubular fitting module is disposed between the vacuum transfer module and the load-lock module, and the tubular fitting module has a first opening and a second opening. The first opening is connected to the load-lock module, and the second opening is connected to the vacuum transfer module. The first opening has a first length in the first horizontal direction, the second opening has a second length in the first horizontal direction, and the first length is larger than the second length. A transfer mechanism transfers a substrate between the one or more substrate processing modules and the load-lock module through the tubular fitting module.

12 Claims, 7 Drawing Sheets

(56) References Cited

U.S. PATENT DOCUMENTS

2022/0208574 A1* 6/2022 Dogome ........... H01L 21/68707
2022/0230898 A1* 7/2022 Dogome ........... H01L 21/67201

FOREIGN PATENT DOCUMENTS

| JP | 2017-500755 A | 1/2017 |
| JP | 2020009855 A | 1/2020 |
| JP | 2020167244 A | 10/2020 |

* cited by examiner

SUBSTRATE PROCESSING APPARATUS

CROSS-REFERENCE TO RELATED APPLICATIONS

This application claims priority to Japanese Patent Application No. 2020-219021 filed on Dec. 28, 2020, the entire contents of which are incorporated herein by reference.

TECHNICAL FIELD

The present disclosure relates to a substrate processing apparatus.

BACKGROUND

Japanese Laid-open Patent Publication No. 2020-009855 discloses a substrate processing apparatus for processing a substrate. The substrate processing apparatus includes an atmospheric part for processing a substrate in an atmospheric atmosphere and a depressurization part for processing a substrate in a depressurized atmosphere. The atmospheric part and the depressurization part are integrally connected via two load-lock modules whose inner atmospheres can be switched between an atmospheric atmosphere and a depressurized atmosphere.

Japanese Laid-open Patent Publication No. 2020-167244 discloses a substrate processing system for processing a substrate. The substrate processing system includes a vacuum transfer chamber maintained in a vacuum atmosphere and an atmospheric transfer chamber maintained in an atmospheric atmosphere. The vacuum transfer chamber and the atmosphere transfer chamber are connected by a plurality of, e.g., three load-lock chambers whose inner atmospheres can be switched between a vacuum atmosphere and an atmospheric atmosphere.

SUMMARY

The technique of the present disclosure provides a substrate processing apparatus in which the number of load-lock chambers is variable without changing a design of a vacuum transfer module.

In accordance with an aspect of the present disclosure, there is provided a substrate processing apparatus, comprising: one or more substrate processing modules; a vacuum transfer module connected to the one or more substrate processing modules; a load-lock module including at least three load-lock chambers arranged along a first horizontal direction; a tubular fitting module disposed between the vacuum transfer module and the load-lock module, the tubular fitting module having a first opening and a second opening, the first opening being connected to the load-lock module, the second opening being connected to the vacuum transfer module, the first opening having a first length in the first horizontal direction, the second opening having a second length in the first horizontal direction, the first length being larger than the second length; and a transfer mechanism disposed in the vacuum transfer module, the transfer mechanism being configured to transfer a substrate between the one or more substrate processing modules and the load-lock module through the tubular fitting module.

BRIEF DESCRIPTION OF THE DRAWINGS

The objects and features of the present disclosure will become apparent from the following description of embodiments, given in conjunction with the accompanying drawings, in which.

DETAILED DESCRIPTION

In a semiconductor device manufacturing process, various steps for processing a semiconductor wafer (substrate: hereinafter simply referred to as "wafer") are executed in a state where a wafer processing module (substrate processing module) containing the wafer is set to a depressurized (vacuum) state. These steps are executed in a wafer processing apparatus including a plurality of wafer processing modules.

The wafer processing apparatus includes, e.g., an atmospheric part including an atmospheric module for processing and/or transferring a wafer in an atmospheric atmosphere, and a depressurization part (vacuum part) for processing and/or transferring a wafer in a depressurized (vacuum) atmosphere. The atmospheric part and the depressurization part are integrally connected through a load-lock module whose inner atmosphere can be switched between an atmospheric atmosphere and a depressurized atmosphere.

In designing a wafer processing apparatus, it is necessary to appropriately design the wafer processing apparatus in which the number of load-lock modules varies as disclosed in Japanese Laid-open Patent Publication Nos. 2020-009855 and 2020-167244 in consideration of various drawbacks such as reduction of footprint of the wafer processing apparatus, improvement of throughput in the wafer processing apparatus, and the like.

However, if the number of load-lock modules varies, a width dimension required for connecting the load-lock modules varies depending on the number of load-lock modules, so that it is necessary to appropriately change a size (particularly, width dimension) of the depressurization part connected thereto. In other words, since it is necessary to change the design of the depressurization part depending on the number of load-lock modules, there are drawbacks such as an increase in cost for designing and manufacturing the wafer processing apparatus and a low degree of freedom in designing the wafer processing apparatus.

In view of the above, the technique of the present disclosure provides a substrate processing apparatus in which the number of load-lock chambers in a load-lock module is variable without changing a design of a vacuum transfer module (depressurization part). Hereinafter, a wafer processing apparatus as the substrate processing apparatus according to the embodiment will be described with reference to the accompanying drawings. Like reference numerals will be given to like parts having substantially the same functions throughout this specification and the drawings, and redundant description thereof will be omitted.

<Wafer Processing Apparatus>

Figure 1:
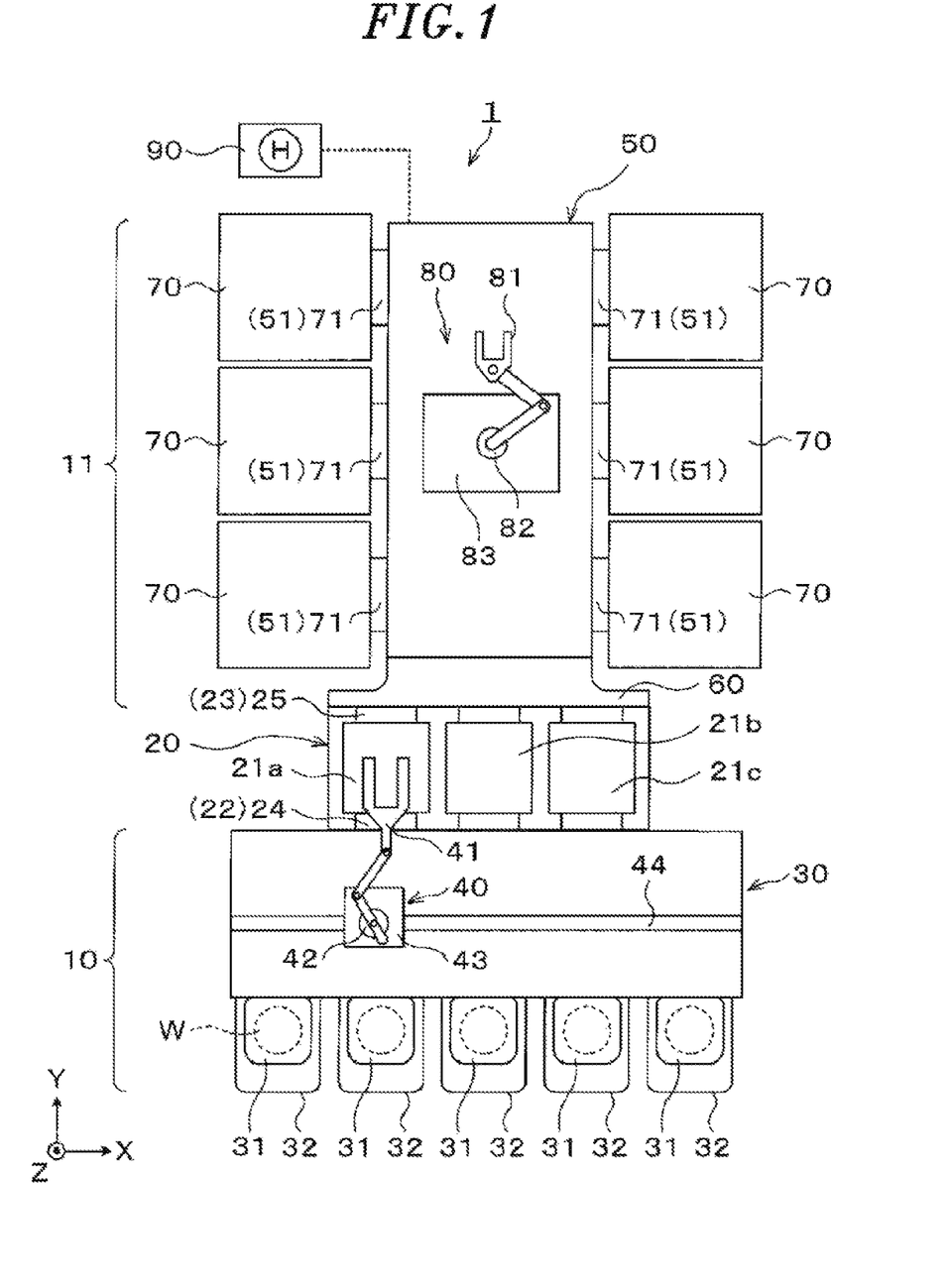
FIG. 1 is a plan view showing a configuration example of a wafer processing apparatus according to an embodiment.

First, the wafer processing apparatus according to the embodiment will be described. FIG. 1 is a plan view showing a schematic configuration of a wafer processing apparatus 1 according to the embodiment. In the present embodiment, a case where the wafer processing apparatus 1 includes a wafer processing module for performing plasma processing such as etching, film formation, diffusion, or the like on a wafer W as a substrate will be described. The module configuration of the wafer processing apparatus 1 of the present disclosure is not limited thereto, and may be arbitrarily selected depending on purposes of wafer processing.

As shown in FIG. 1, the wafer processing apparatus 1 has a configuration in which an atmospheric part 10 and a depressurization part (vacuum part) 11 are integrally connected through a load-lock module 20. The atmospheric part 10 includes an atmospheric module for processing and/or transferring the wafer W in an atmospheric atmosphere. The depressurization part 11 includes a decompression module (vacuum module) for processing and/or transferring the wafer W in a depressurized (vacuum) atmosphere.

The load-lock module 20 includes a plurality of (e.g., three in the present embodiment) load-lock chambers 21a, 21b, and 21c arranged along a width direction (X-axis direction: first horizontal direction) of a loader module 30 to be described later and a tubular fitting module 60 to be described later. In one embodiment, the load-lock module 20 includes three load-lock chambers 21a, 21b, and 21c arranged along the first horizontal direction.

The load-lock chambers 21a, 21b, and 21c (hereinafter, they may be simply referred to as "load-lock chambers 21") allow the inner space of the loader module 30 to be described later in the atmospheric part 10 and the inner space of the transfer module 50 to be described later in the depressurization part 11 to communicate with each other through wafer transfer ports 22 and 23. The wafer transfer ports 22 and 23 can be opened and closed by gate valves 24 and 25, respectively.

The load-lock chambers 21 are configured to temporarily hold the wafer W. Further, the inner atmospheres of the load-lock chambers 21 can be switched between an atmospheric atmosphere and a depressurized atmosphere (vacuum state). In other words, the load-lock module 20 is configured to appropriately transfer the wafer W between the atmospheric part 10 in the atmospheric atmosphere and the depressurized part 11 in the depressurized atmosphere.

A detailed configuration of the load-lock module 20 will be described later.

The atmospheric part 10 includes the loader module 30 having a wafer transfer mechanism 40 to be described later, and a load port 32 on which a FOUP 31 capable of storing a plurality of wafers W is placed. An orientation module (not shown) for adjusting a horizontal direction of the wafer W, a storage module (not shown) for storing a plurality of wafers W, and the like may be disposed adjacent to the loader module 30.

The loader module 30 has a rectangular housing maintained in an atmospheric atmosphere. A plurality of, e.g., five load ports 32 are arranged side by side on one longitudinal side of the loader module 30 in a negative direction of the Y-axis. The load-lock chambers 21a, 21b, and 21c of the load-lock module 20 are arranged side by side on the other longitudinal side of the loader module 30 in a positive direction of the Y-axis.

The wafer transfer mechanism 40 for transferring the wafer W is disposed in the loader module 30. The wafer transfer mechanism 40 includes a transfer arm 41 for holding and moving the wafer W, a rotatable table 42 for rotatably supporting the transfer arm 41, and a rotatable table base 43 on which the rotatable table 42 is placed. Further, a guide rail 44 extending in a longitudinal direction (X-axis direction) of the loader module 30 is disposed in the loader module 30. The rotatable table base 43 is disposed on the guide rail 44, and the wafer transfer mechanism 40 is configured to be movable along the guide rail 44.

The depressurization part 11 includes the transfer module 50 for transferring the wafer W therein, the tubular fitting module 60 that connects the load-lock module 20 and the transfer module 50, and wafer processing modules 70 for performing desired processing on the wafer W transferred from the transfer module 50. The inner atmospheres of the transfer module 50, the tubular fitting module 60, and the wafer processing modules 70 can be maintained in a depressurized atmosphere. In the present embodiment, a plurality of, e.g., six wafer processing modules 70 are connected to one transfer module 50. The number and the arrangement of the wafer processing modules 70 are not limited to those described in the present embodiment, and may be set in any appropriate manners.

The transfer module 50 as a vacuum transfer module is connected to the load-lock module 20 through the cylindrical fitting module 60, as described above. The transfer module 50 is connected to one or a plurality of wafer processing modules 70. The transfer module 50 transfers the wafer W from the load-lock chamber 21a of the load-lock module 20 to one wafer processing module 70. The wafer W is processed, and then transferred to the atmospheric part 10 through the load-lock chamber 21c of the load-lock module 20. A detailed configuration of the transfer module 50 will be described later.

A wafer transfer mechanism 80 as a transfer mechanism for transferring the wafer W is disposed in the transfer module 50. The wafer transfer mechanism 80 is configured to transfer the wafer W between one or a plurality of wafer processing modules 70 and the load-lock module 20 through the cylindrical fitting module 60 to be described later. The wafer transfer mechanism 80 includes a transfer arm 81 for holding and moving the wafer W, a rotatable table 82 for rotatably supporting the transfer arm 81, and a rotatable table base 83 on which the rotatable table 82 is placed. The rotatable table base 83 is fixed to a central portion of the transfer module 50.

The tubular fitting module 60 connects the load-lock module 20 and the transfer module 50, as described above. A detailed configuration of the tubular fitting module 60 will be described later.

The wafer processing modules 70 perform plasma processing such as etching, film formation, diffusion, or the like on the wafer W. In other words, the wafer processing modules 70 may include a plasma processing module. The wafer processing modules 70 may include various modules for performing processing depending on purposes of wafer processing. Further, the wafer processing modules 70 communicate with the transfer module 50 through wafer transfer ports 51 formed on sidewalls of the transfer module 50, and the wafer transfer ports 51 can be opened and closed by gate valves 71.

As shown in FIG. 1, the wafer processing apparatus 1 configured as described above includes a controller 90. The controller 90 is, e.g., a computer having a CPU, a memory, or the like, and includes a program storage (not shown). The program storage stores a program for controlling the processing of the wafer W in the wafer processing apparatus 1. The program may be recorded in a computer-readable storage medium H and may be retrieved from the storage medium H and installed on the controller 90.

Figure 2:
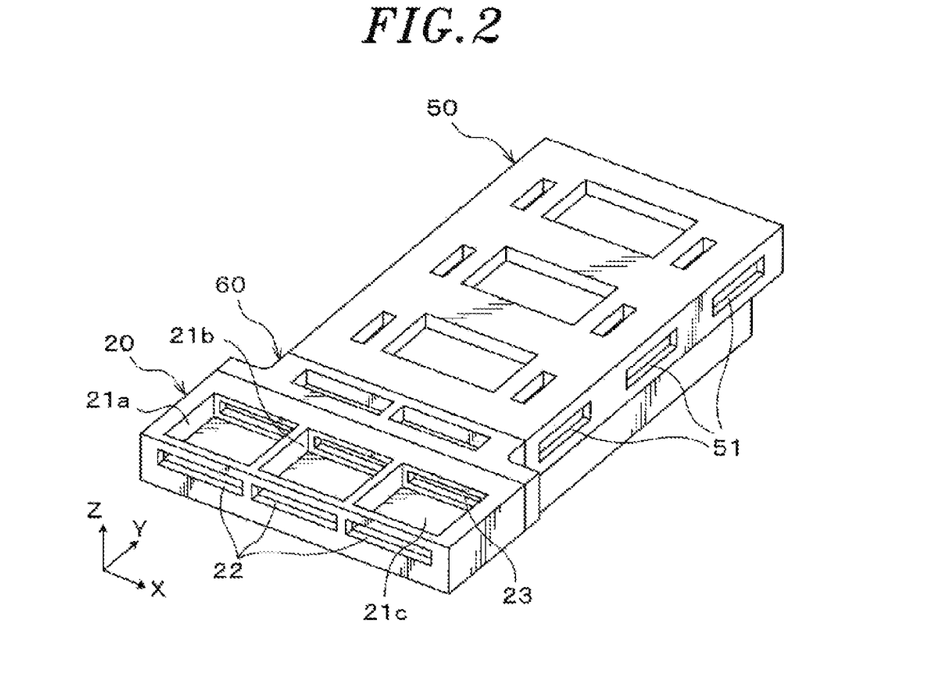
FIG. 2 is a perspective view showing a configuration example of a vacuum transfer part according to the embodiment.
Figure 3:
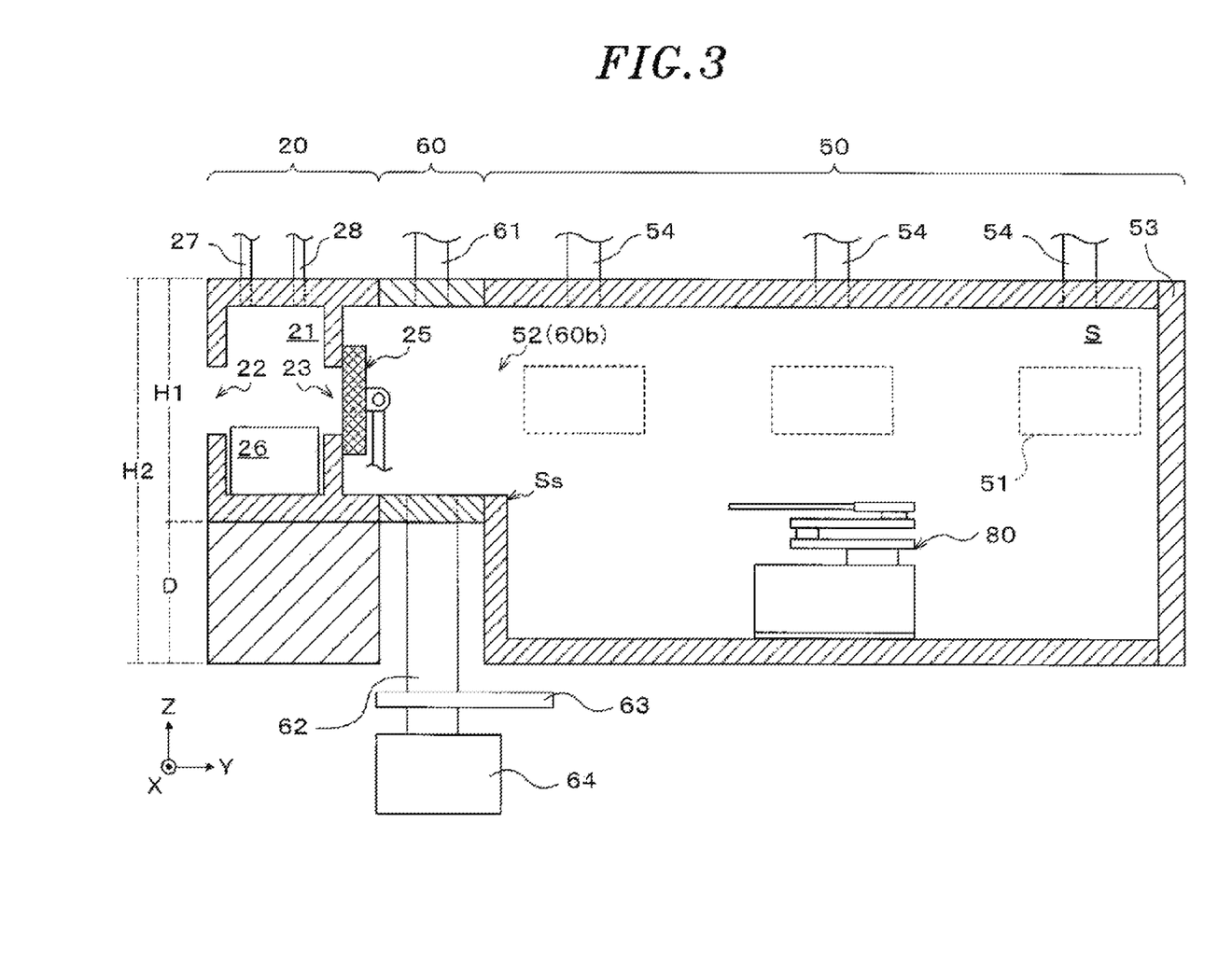
FIG. 3 is a vertical cross-sectional view showing the configuration example of the vacuum transfer part according to the embodiment.
Figure 4:
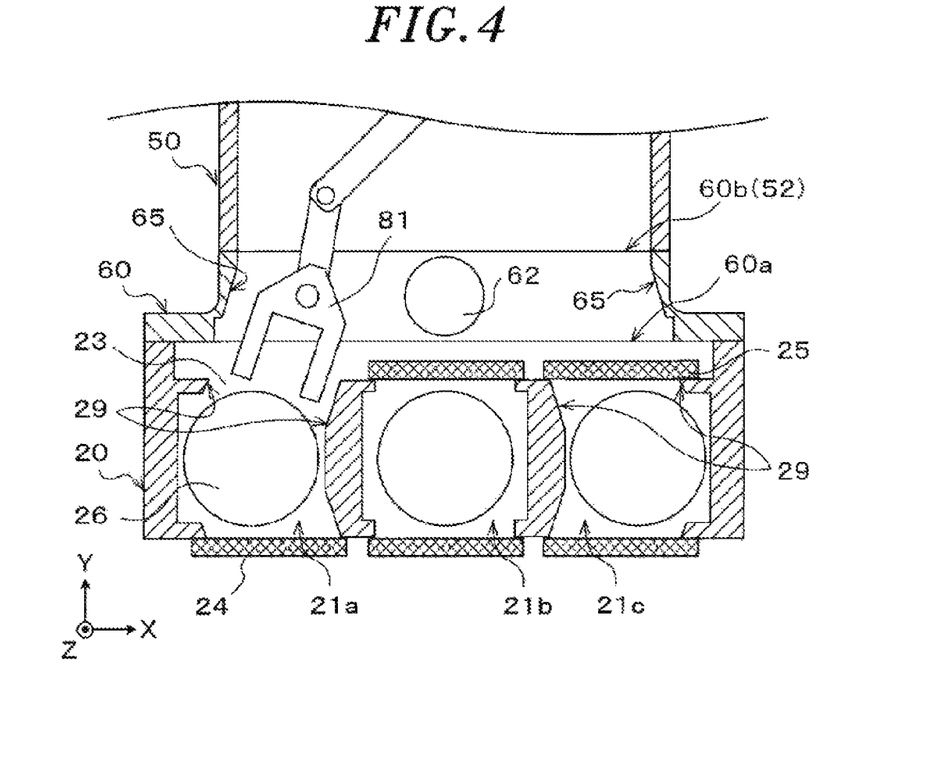
FIG. 4 is a horizontal cross-sectional view showing a configuration example of a cylindrical fitting module according to the embodiment.

The wafer processing apparatus 1 according to the present embodiment is configured as described above. Hereinafter, detailed configurations of the load-lock module 20, the transfer module 50, and the tubular fitting module 60 will be described. FIGS. 2 and 3 are respectively a perspective view and a vertical cross-sectional view showing schematic configurations of the load-lock module 20, the transfer module 50, and the tubular fitting module 60. FIG. 4 is a horizontal cross-sectional view showing schematic configurations of the load-lock module 20 and the tubular fitting module 60.

As shown in FIGS. 2 and 3, the load-lock module 20, the tubular fitting module 60, and the transfer module 50 are connected side by side in that order from the negative side of the Y-axis.

As shown in FIGS. 2 and 4, the load-lock module 20 has the three load-lock chambers 21a, 21b, and 21c arranged side by side along the width direction (X-axis direction) of the tubular fitting module 60. A wafer transfer port 22 for transferring a wafer W to and from the loader module 30 and a wafer transfer port 23 as a substrate transfer port for transferring a wafer W to and from the transfer module 50 are formed in each of the three load-lock chambers 21. In other words, three wafer transfer ports 22 and three wafer ports 23 are formed on the sidewall of the load-lock module 20 on the negative side of the Y-axis and the sidewall of the load-lock module on the positive side of the Y-axis, respectively.

As described above, the load-lock chambers 21 of the load-lock module 20 are connected to the loader module 30 and the transfer module 50 through the gate valves 24 (not shown in FIGS. 2 and 3) and the gate valves 25 (not shown in FIG. 2), respectively. The gate valves 24 and 25 ensure airtightness between the load-lock chambers 21 and the loader module 30 and between the load-lock chambers 21 and the transfer module 50 and communication therebetween.

As shown in FIG. 3, the load-lock chamber 21 is provided with a stocker 26 for temporarily holding the wafer W transferred between the loader module 30 and the transfer module 50.

Further, as shown in FIG. 3, an air supply port 27 for supplying a gas into the load-lock chamber 21 and a venting port 28 for venting a gas are connected to the load-lock module 20. The load-lock module 20 is configured such that the inner atmospheres of the load-lock chambers 21 can be switched between an atmospheric atmosphere and a depressurized atmosphere by the air supply port 27 and the venting port 28.

An opening 52 through which the wafer W is transferred to and from the tubular fitting module 60 is formed at one end of the transfer module 50 on the negative side of the Y-axis to which the tubular fitting module 60 is connected.

Further, the other end of the transfer module 50 on the positive side of the Y-axis is closed by an end plate 53 as a plate.

As illustrated, no plate or gate valve is disposed between the transfer module 50 and the tubular fitting module 60. In other words, the inner space of the transfer module and the inner space of the tubular fitting module 60 communicate with each other, thereby defining an integrated transfer space S where the wafer W is transferred by the wafer transfer mechanism 80. In one embodiment, the opening 52 of the transfer module 50 is dimensionally fitted to an opening (second opening 60b to be described below) of the tubular fitting module 60.

As described above, a plurality of (six to correspond to the number of wafer processing modules 70 in the present embodiment) wafer transfer ports 51 communicating with the wafer processing modules 70 are formed on the longitudinal sides of the transfer module 50 on the negative side and the positive side of the X-axis. The wafer transfer ports 51 can be opened and closed by the gate valves 71 (not shown in FIGS. 2 and 3).

Further, a gas supply 54 for supplying an inert gas (e.g., $N_2$ gas) to the transfer space S is connected to a ceiling surface of the transfer module 50 that is located above the wafer transfer ports 51.

The gas supply 54 supplies an inert gas to the transfer space S to shut off the wafer transfer ports 51, i.e., to form an air curtain. Therefore, scattering of particles or the like from the wafer processing modules 70 into the transfer module 50 at the time of opening the gate valves 71 is suppressed.

Further, the gas supply 54 supplies an inert gas into the transfer space S to eliminate stagnation of air flow in the transfer space S and appropriately exhaust the transfer space S using an exhaust mechanism 64 (to be described later) connected to the tubular fitting module 60.

Figure 5:
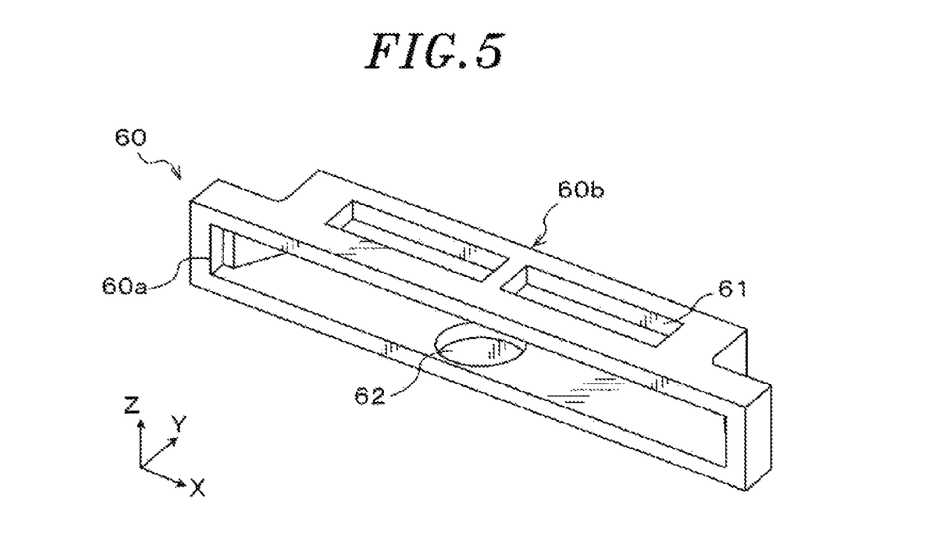
FIG. 5 is a perspective view showing the configuration example of the cylindrical fitting module according to the embodiment.

FIG. 5 is a perspective view showing a schematic configuration of the tubular fitting module 60. As described above, the tubular fitting module 60 connects the load-lock module 20 and the transfer module 50.

The tubular fitting module 60 is formed in a substantially tubular shape having a first opening 60a formed on one side surface connected to the load-lock module 20 (on the negative side of the Y-axis) and a second opening 60b formed on the other side surface connected to the transfer module 50 (on the positive side of the Y-axis). In one embodiment, the tubular fitting module 60 is disposed between the vacuum transfer module 50 and the load-lock module 20 and has the first opening 60a and the second opening 60b. The first opening 60a is connected to the load-lock module 20. The second opening 60b is connected to the vacuum transfer module 50. The first opening 60a has a first length in the first horizontal direction (X-axis direction). The second opening 60b has a second length in the first horizontal direction (X-axis direction). The first length is greater than the second length. In one embodiment, the tubular fitting module 60 has an inner space communicating with the first opening 60a and the second opening 60b. The inner space of the tubular fitting module 60 communicates with the inner space of the vacuum transfer module 50 through the second opening 60b.

Here, when the load-lock module 20 has a plurality of, e.g., three or more load-lock chambers 21 as in the wafer processing apparatus 1 according to the present embodiment, the width dimension (X-axis direction: dimension in the first horizontal direction) of the load-lock module 20 may be greater than the width dimension (X-axis direction:

dimension in the first horizontal direction) of the transfer module 50 as shown in FIG. 4.

Therefore, as shown in FIG. 4, in the tubular fitting module 60 according to the present embodiment, the width dimension on one side surface (on the negative side of the Y-axis) connected to the load-lock module 20 is greater than the width dimension on the other side surface (on the positive side of the Y-axis) connected to the transfer module 50. Similarly, the first opening 60a on one side surface (on the negative side of the Y-axis) connected to the load-lock module 20 is greater in at least the width direction (X-axis direction) than the second opening 60b on the other side surface (on the positive side of the Y-axis) connected to the transfer module 50.

Specifically, the first opening 60a has a size that allows the wafer W to be appropriately transferred between the load-lock chambers 21a, 21b, and 21c of the load-lock module 20 and the transfer module 50. In other words, the first opening 60a has a size that covers all the three wafer transfer ports 23 formed on the wall surface of the load-lock module 20 on the positive side of the Y-axis.

Further, the second opening 60b has substantially the same size as that of the opening 52 formed at one end of the transfer module 50. In other words, the second opening 60b has a size that is substantially the same as the width dimension of the transfer module 50.

By setting the width dimension of the tubular fitting module 60 on one side surface (on the negative side of the Y-axis) connected to the load-lock module 20 to be different from the width dimension of the tubular fitting module 60 on the other side surface (on the positive side of the Y-axis) connected to the transfer module 50, the load-lock module 20 and the transfer module 50 can be appropriately connected even when the width dimension (dimension in the X-axis direction) of the load-lock module 20 and the width dimension (dimension in the X-axis direction) of the transfer module 50 are different as in the present embodiment.

In other words, even in the case of designing the wafer processing apparatus 1 in which the number of load-lock chambers 21 in the load-lock module 20 is variable, the load-lock module 20 and the transfer module 50 can be appropriately connected simply by changing the width dimension of the tubular fitting module 60 on one side surface (on the negative side of the Y-axis) connected to the load-lock module 20.

A height dimension H1 of the tubular fitting module 60 is smaller than a height dimension H2 of the transfer module 50. The tubular fitting module 60 is connected to the transfer module 50 such that its ceiling surface is located substantially on the same plane as the ceiling surface of the transfer module 50. In other words, as shown in FIG. 3, a stepped portion $S_s$ generated by a difference D between the height dimension H1 and the height dimension H2 is formed at a lower portion of the transfer space S.

A gas supply (inert gas supply source) 61 for supplying an inert gas (e.g., N₂ gas) to the transfer space S is connected to the ceiling surface of the tubular fitting module 60.

The gas supply 61 supplies an inert gas to the transfer space S to shut off the wafer transfer port 23 formed in the load-lock chamber 21, i.e., to form an air curtain. Therefore, scattering of particles or the like between the load-lock module 20 and the transfer module 50 at the time of opening the gate valve 25 is suppressed.

Further, the gas supply 61 supplies an inert gas into the transfer space S to eliminate stagnation of air flow in the transfer space S and appropriately exhaust the transfer space S using the exhaust mechanism 64 to be described later.

Further, the exhaust mechanism 64 for exhausting the transfer space S is connected to the bottom surface of the tubular fitting module 60 through a connection line 62 and a pressure control valve 63. In one embodiment, the tubular fitting module 60 has a gas supply port that can be connected to the gas supply (inert gas supply source) 61 and an exhaust port that can be connected to the exhaust mechanism 64.

The connection line 62 may be a pipe-shaped member having a diameter smaller than at least a depth dimension (dimension in the Y-axis direction) of the tubular fitting module 60 and having a total length greater than the difference D between the height dimension H1 of the tubular fitting module 60 and the height dimension H2 of the transfer module 50. In other words, the connection line 62 is disposed in a space between the load-lock module 20 and the transfer module 50 that is formed under the tubular fitting module 60, and connects the pressure control valve 63 and the exhaust mechanism 64 at a position lower than at least the bottom surface of the transfer module 50. In one embodiment, the tubular fitting module 60 has a third length in the second horizontal direction (Y-axis) orthogonal to the first horizontal direction (X-axis), and the diameter of the connection line 62 is smaller than the third length.

The pressure control valve 63 (e.g., APC valve) is opened and closed to adjust the evacuation of the transfer space S performed by the exhaust mechanism 64, i.e., to adjust a vacuum level of the transfer space S.

The exhaust mechanism 64 includes a first vacuum pump (e.g., dry pump) for evacuating the transfer space S to an intermediate vacuum level, and a second vacuum pump (e.g., turbo molecular pump) for evacuating the transfer space S to a high vacuum level.

In the wafer processing apparatus 1, in order to reduce the footprint of the wafer processing apparatus 1, it is preferable to minimize the depth dimension (dimension in the Y-axis direction) of the tubular fitting module 60. However, when the depth dimension of the tubular fitting module 60 is reduced, the depth dimension of the tubular fitting module 60 becomes smaller compared to the size of the pressure control valve 63 or the exhaust mechanism 64 (particularly, the turbo molecular pump), which makes it difficult, in some cases, to connect the pressure control valve 63 or the exhaust mechanism 64 under the tubular fitting module 60.

Therefore, in the present embodiment, the line of the exhaust mechanism 64 is extended using the connection line 62 having a diameter smaller than the depth dimension of the tubular fitting module 60. Accordingly, the pressure control valve 63 and the exhaust mechanism 64 are connected at a height position located below at least the bottom surface of the transfer module 50, more specifically, at a height position where they do not interfere with the peripheral units or the components of the wafer processing apparatus 1.

When the diameter of the connection line 62 is selected to correspond to the depth dimension of the tubular fitting module 60, it may be necessary to provide the connection line 62 having a diameter smaller than the standard dimension required for connection of the exhaust mechanism 64 (particularly, the turbo molecular pump). In that case, fastening members (e.g., screws or the like: not shown) used for fastening the connection line 62 or the pressure control valve 63 may be damaged by a reaction force generated when the exhaust mechanism 64 is driven or damaged, for example.

Therefore, in the present embodiment, when the exhaust mechanism 64 is connected using the connection line 62 having a diameter smaller than the standard dimension required for the connection of the exhaust mechanism 64, it is preferable to increase the number of fastening members used for fastening the connection line 62 or the pressure control valve 63 or to increase the diameter of the fastening members. By changing the number or the diameter of the fastening members, the fastening strength of the connection line 62 or the pressure control valve 63 can be enhanced, which makes it possible to suppress damage to the fastening members due to the reaction force generated when the exhaust mechanism 64 is driven or damaged.

In the present embodiment, the exhaust mechanism 64 is connected to the bottom surface of the tubular fitting module 60, but the connection location of the exhaust mechanism 64 is not limited thereto. In other words, as long as the pressure control valve 63 or the exhaust mechanism 64 can be properly installed, the transfer space S may be exhausted from the side surface or the bottom surface of the transfer module 50 instead of or in addition to the bottom surface of the tubular fitting module 60.

In the wafer processing apparatus 1 according to the present embodiment, sidewall surfaces 29 (see FIG. 4) forming the wafer transfer port 23 of the load-lock chamber 21 that is the transfer path of the wafer W between the load-lock module 20 and the transfer module 50, and sidewall surfaces 65 (see FIG. 4) of the tubular fitting module 60 are inclined along the direction in which the wafer W is transferred by the transfer arm 81 of the wafer transfer mechanism 80 (direction in which the transfer arm 81 enters the load-lock chamber 21).

As described above, when the load-lock module 20 has a plurality of, e.g., three or more load-lock modules 21, the width dimension (dimension in the X-axis direction) of the load-lock module 20 may be greater than the width dimension (dimension in the X-axis direction) of the transfer module 50. In that case, if the wafer transfer ports 23 are formed perpendicular to the load-lock chambers 21, the transfer arm 81 may not property transfer the wafer W due to the interference with the wafer transfer ports 23 or the sidewall surfaces of the tubular fitting module 60 in two load-lock chambers 21a and 21c located at both sides among the three load-lock chambers 21 arranged side by side in the X-axis direction.

Therefore, in the load-lock chambers 21a and 21c according to the present embodiment, the sidewall surfaces 29 forming the wafer transfer port 23 are inclined along the transfer direction of the wafer W (the approach direction of the transfer arm 81) so that the transfer arm 81 can diagonally enter the load-lock chambers 21 as shown in FIG. 4. Accordingly, the interference between the wafer transfer port 23 and the transfer arm 81 can be suppressed, and the wafer W can be appropriately transferred.

In addition, since the sidewall surfaces 65 of the tubular fitting module 60 are inclined along the transfer direction of the wafer W as shown in FIG. 4, the interference between the sidewall surfaces 65 of the tubular fitting module 60 and the transfer arm 81 can be further suppressed, and the wafer W can be more appropriately transferred.

As shown in FIG. 4, in the load-lock chamber 21b located at the center among the three load-lock chambers 21 arranged side by side in the X-axis direction, the sidewall surfaces 29 need not be inclined and may be formed perpendicular to the load-lock chamber 21 along the transfer direction of the wafer W. Further, in addition to the sidewall surfaces 29 forming the wafer transfer ports 23, sidewall surfaces (having no reference numeral) forming the wafer transfer ports 22 between the load-lock module 20 and the loader module 30 may be formed along the transfer direction of the wafer W (the approach direction of the transfer arm 41).

In the wafer processing apparatus 1 according to the present embodiment, the load-lock module 20, the transfer module 50, and the tubular fitting module 60 constituting a vacuum transfer part are configured as described above.

In accordance with the wafer processing apparatus 1 according to the present embodiment, the transfer module 50 for transferring the wafer W in a depressurized environment and the load-lock module 20 for transferring the wafer W between the transfer module 50 and the atmospheric part 10 are connected by the substantially tubular fitting module 60 having different width dimensions (dimensions in the X-axis direction) on one side surface (negative side of the Y-axis) and the other side surface (positive side of the Y-axis). Accordingly, even when it is necessary to connect the load-lock module 20 and the transfer module 50 having different width dimensions as in the present embodiment, the load-lock module 20 and the transfer module 50 can be appropriately connected.

Further, in accordance with the wafer processing apparatus 1 according to the present embodiment, even when it is necessary to design the wafer processing apparatus 1 in which the number of load-lock chambers 21 in the load-lock module 20 is variable depending on various demands, it is only required to redesign the width dimension on one side surface of the tubular fitting module 60 that is connected to the load-lock module 20. In other words, since it is not necessary to change the design of the transfer module 50 depending on the number of load-lock chambers 21 as in the conventional case, the cost required for designing and manufacturing the wafer processing apparatus 1 can be reduced, and the degree of freedom of designing the wafer processing apparatus 1 can be improved.

Conventionally, driving mechanisms (not shown) of the gate valves 71 or various units connected to the wafer processing modules 70 are disposed under the transfer module 50, so that it is difficult to ensure the installation space of the exhaust mechanism for reducing a pressure in the inner space (the transfer space S) of the transfer module 50.

In this respect, in the present embodiment, the exhaust mechanism 64 is connected to the bottom surface of the tubular fitting module 60 through the connection line 62. By providing the tubular fitting module 60, the installation space of the exhaust mechanism 64 can be ensured. Further, since the exhaust path is extended by the connection line 62, the exhaust mechanism 64 can be installed without interference with the driving mechanisms (not shown) of the gate valves 71 or various units.

Further, since the installation space of the exhaust mechanism 64 can be appropriately ensured by extending the exhaust path using the connection line 62, in the present embodiment, the molecular turbo pump and the pressure control valve 63 can be further connected to the transfer space S in addition to a dry pump generally used as the exhaust mechanism 64 in a conventional case. Accordingly, a vacuum level in the transfer space S can be further improved compared to the conventional case, and the wafer processing in the wafer processing apparatus 1 can be performed more appropriately.

As described above, conventionally, the wafer processing apparatuses 1 having different numbers of load-lock chambers 21 in the load-lock module 20 have been designed in response to various demands. In other words, since the design was optimized depending on the number of load-lock chambers 21, it was difficult to design an additional unit in the wafer processing apparatus 1, i.e., to perform modification for adding a function of the wafer processing apparatus 1. (e.g., to change the number of load-lock chambers 21).

In this respect, in the present embodiment, the number of load-lock chambers 21 is variable simply by attaching/detaching or replacing the tubular fitting module 60 in the wafer processing apparatus 1.

Specifically, when the load-lock module 20 has three load-lock chambers 21 arranged side by side in the width direction, for example, the load-lock module 20 and the transfer module 50 having different width dimensions can be appropriately connected by providing the tubular fitting module 60 therebetween as shown in FIGS. 1 and 5.

Figure 6:
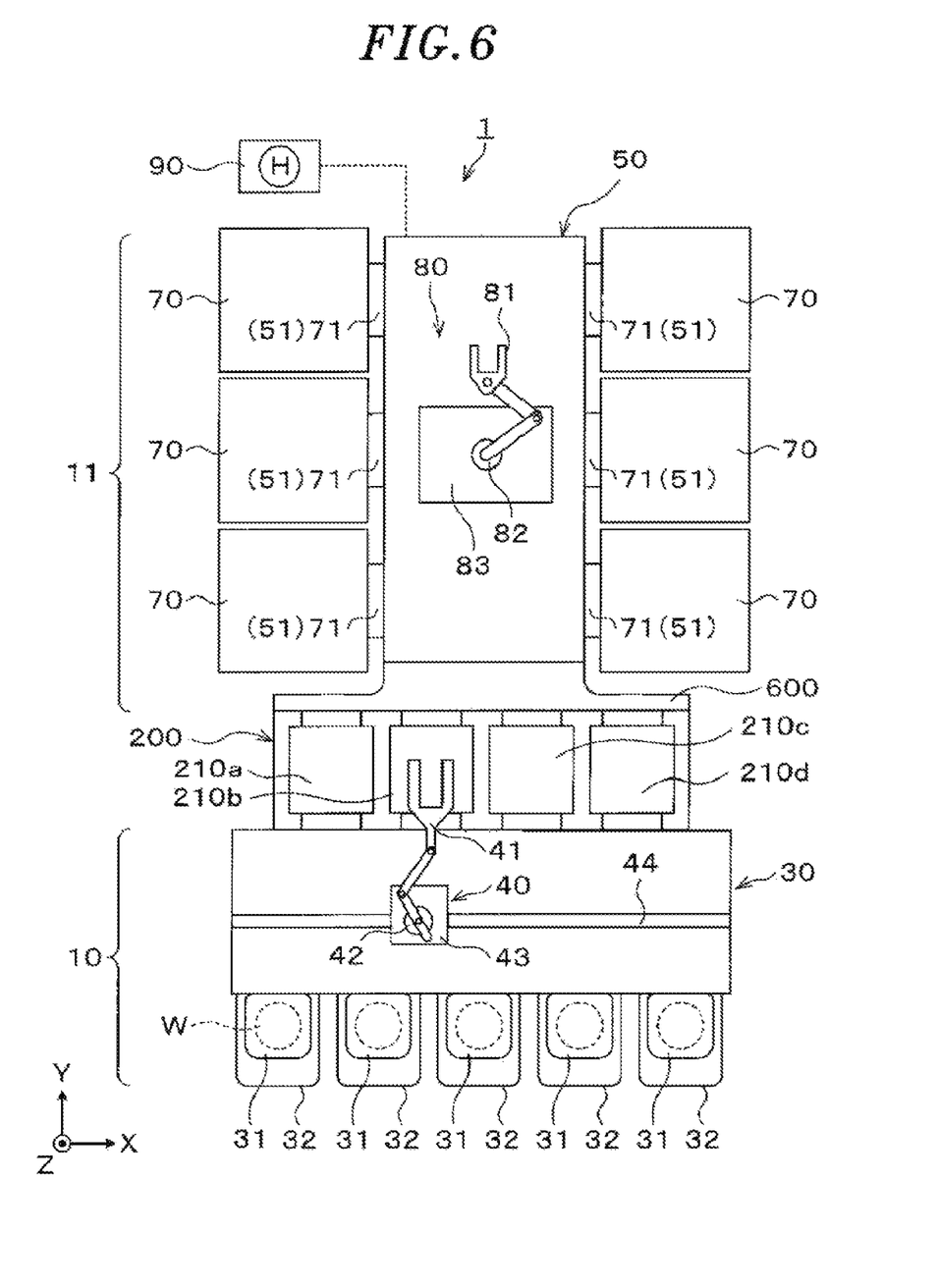
FIG. 6 is a plan view showing a configuration example of a wafer processing apparatus according to another embodiment.

In the wafer processing apparatus 1, in the case of increasing the number of load-lock chambers 21 to four, for example, the load-lock module 200 having the four load-lock chambers 210a to 210d may be connected to the conventional transfer module 50 through the tubular fitting module 600 in which only the width dimension (and the width dimension of the first opening) of an end portion on one side surface (negative side of the Y-axis) is changed as shown in FIG. 6.

Figure 7:
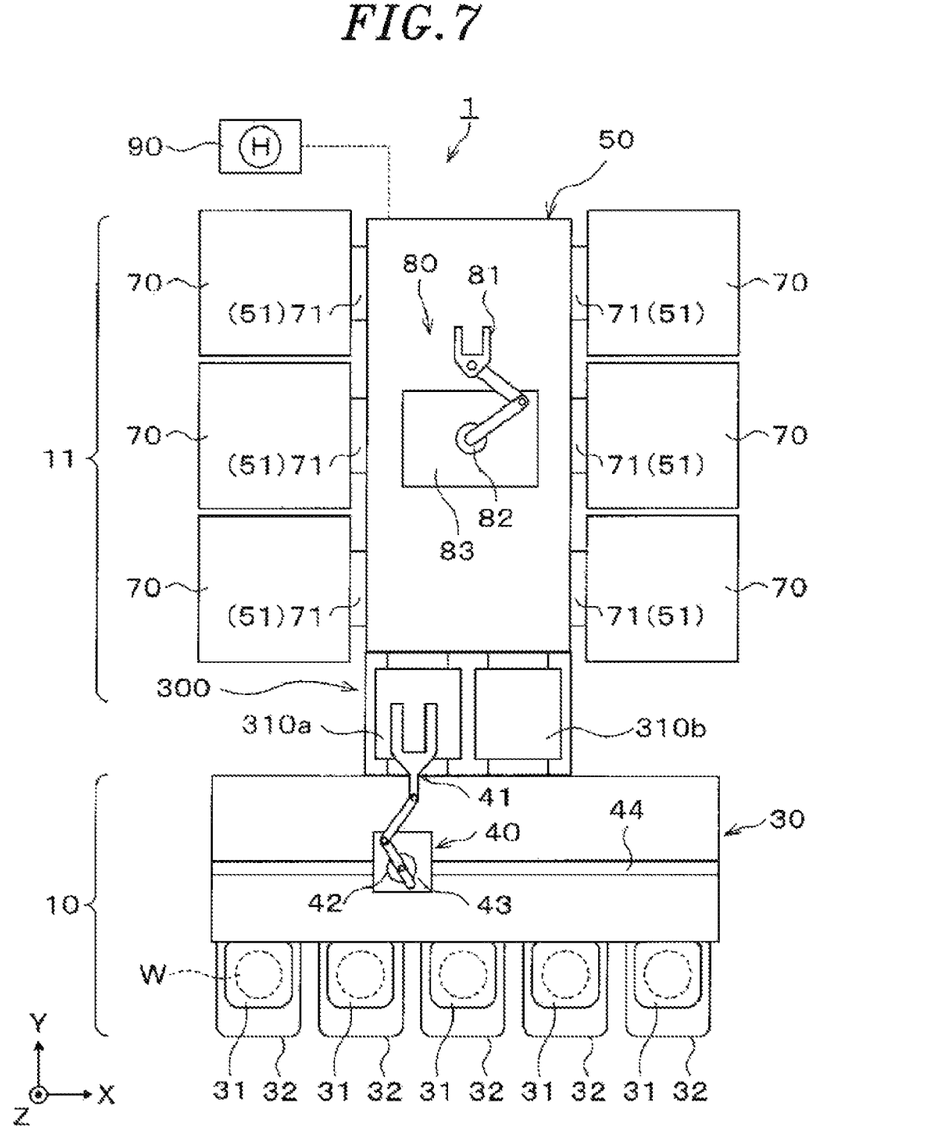
FIG. 7 is a plan view showing the configuration example of the wafer processing apparatus according to another embodiment.

In the wafer processing apparatus 1, in the case of reducing the number of load-lock chambers 21 to two, for example, if a width dimension (or at least the width dimension of the first opening) of a load-lock module 300 including two load-lock chambers 310a and 310b is the same as the width dimension of the conventional transfer module 50, it is possible to omit the tubular fitting module 60 and connect the load-lock module 300 and the transfer module 50 as shown in FIG. 7.

To sum up, in the case of changing the number of load-lock chambers of the load-lock module in the wafer processing apparatus 1, a replaceable unit as a flexible system including the load-lock module for transferring the wafer W to and from the atmospheric part 10 may be appropriately selected and replaced depending on the number of target load-lock chambers. In one embodiment, the flexible system is connected between the vacuum transfer module 50 and the atmospheric transfer module 30 and selectively includes any one of a first replaceable unit or a second replaceable unit.

Additionally, in the example in which three load-lock chambers 21 are provided as shown in FIGS. 1 and 5, for example, the load-lock module 20 and the tubular fitting module 60 constitute "the second replaceable unit".

In the example in which four load-lock chambers 210 are provided as shown in FIG. 6, the load-lock module 200 and the tubular fitting module 600 constitute "the second replaceable unit". In one embodiment, the second replaceable unit includes the second load-lock module 20 (or 200) and the tubular fitting module 60 (or 600). The second load-lock module 20 (or 200) includes at least three load-lock chambers arranged side by side in the width direction. The width dimension of the second load-lock module 20 (or 200) is greater than the width dimension of the first load-lock module 300. The tubular fitting module 60 (or 600) is disposed between the vacuum transfer module 50 and the second load-lock module 20 (or 200) and has the first opening 60a and the second opening 60b. The first opening 60a is connected to the second load-lock module 20 (or 200), and the second opening 60b is connected to the vacuum transfer module 50. The width dimension of the first opening 60a is greater than the width dimension of the second opening 60b.

Further, in the example in which two load-lock chambers 310 are provided as shown in FIG. 7, the load-lock module 300 constitutes the "first replaceable unit". In one embodiment, the first replaceable unit includes the first load-lock module 300 connected to the vacuum transfer module 50 and including two load-lock chambers arranged side by side in the width direction.

At this time, in each "delivery unit", it is preferable that the width dimension of the end portion on the positive side of the Y-axis of the tubular fitting modules 60 and 600 or the load-lock module 300 connected to the transfer module 50 is the same as the width dimension of the transfer module 50. In other words, it is preferable that the width dimension of the end portion on the positive side of the Y-axis of each delivery unit allows the connection between each delivery unit and the transfer module 50.

The number of load-lock chambers 21 can be changed simply by preparing the delivery unit including the load-lock module for transferring the wafer W between the transfer module 50 for transferring the wafer W under a depressurized environment and the atmospheric part 10 and by exchanging the delivery unit depending on the number of target load-lock chambers. At this time, as described above, it is not necessary to change the design of the transfer module 50 depending on the number of load-lock chambers, so that the cost or man-hour required to change the number of load-lock chambers can be appropriately reduced compared to the conventional case.

When the width dimension of the load-lock module 300 and the width dimension of the transfer module 50 are the same, the installation of the tubular fitting module 60 is omitted as shown in FIG. 7. However, even when the width dimension of the load-lock module 300 and the width dimension of the transfer module 50 are the same, the tubular fitting module may be interposed therebetween. By connecting the load-lock module 300 to the transfer module 50 through the tubular fitting module, the turbo molecular pump as the pressure control valve 63 and the exhaust mechanism 64 can be appropriately connected to the transfer space S through the connection line 62 as described above.

Figure 8:
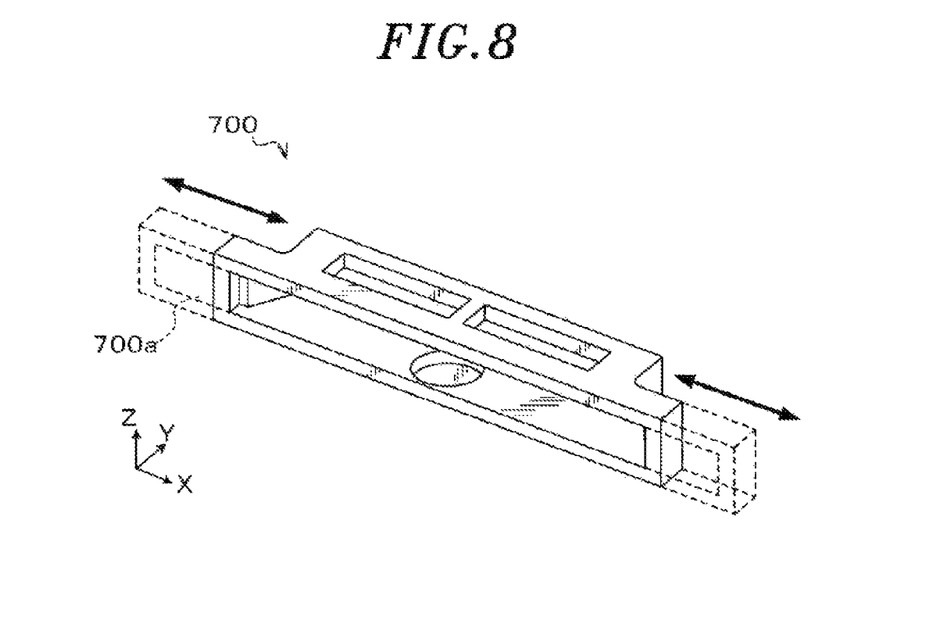
FIG. 8 is a perspective view showing a configuration example of a cylindrical fitting module according to another embodiment.

In the above-described embodiment, multiple tubular fitting modules having different width dimensions on one side surface (negative side of the Y-axis) are designed depending on the number of load-lock chambers in the load-lock module. However, the tubular fitting module may be configured to be extensible and contractible in a width direction on one side surface (negative side of the Y-axis), for example. In other words, as shown in FIG. 8, one cylindrical fitting module 700 may be configured such that a width dimension of one side surface connected to the load-lock module and a width dimension of a first opening 700a can be adjusted depending on the number of load-lock chambers. Since the tubular fitting module 700 is extensible and contractible in the width direction, it is not necessary to change the design of the tubular fitting module 700 depending on the number of load-lock chambers 21. Accordingly, the cost for designing and manufacturing the wafer processing apparatus 1 can be further reduced, and a degree of freedom of designing the wafer processing apparatus 1 can be improved.

In the above embodiment, the case where the wafer W is transferred in the load-lock module 20, the transfer module 50, and the tubular fitting module 60 constituting the vacuum transfer part has been described as an example. However, when the wafer W is subjected to plasma processing in the wafer processing modules 70 as in the wafer processing apparatus 1 according to the present embodiment, the vacuum transfer part may be configured to further transfer the edge ring ER. The edge ring ER is an annular member disposed to surround the periphery of the wafer W during plasma processing.

More specifically, in the depressurization part 11, for example, a storage module (not shown) that stores the edge ring ER may be provided instead of or in addition to one wafer processing module 70, and the wafer transfer mechanism 80 may be configured to transfer the edge ring ER.

Figure 9:
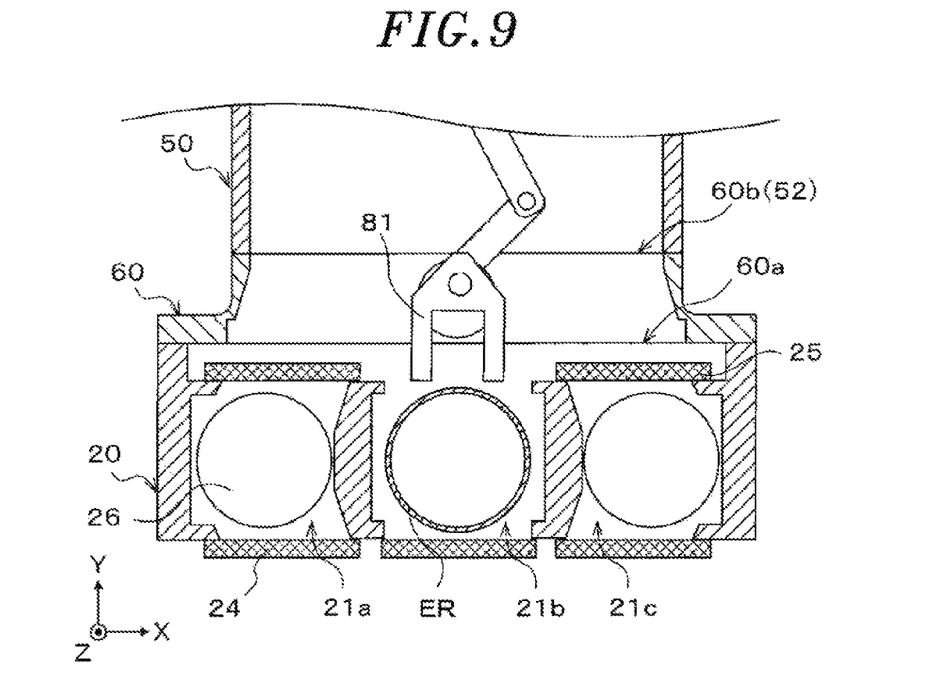
FIG. 9 is a plan view showing a configuration example of a wafer processing apparatus according to still another embodiment.

Alternatively, in the atmospheric part 10, for example, a storage module (not shown) that stores the edge ring ER may be disposed adjacent to the loader module 30, and the wafer transfer mechanism 40 and the wafer transfer mechanism 80 may be configured to transfer the edge ring ER. In that case, as shown in FIG. 9, the edge ring ER can be disposed in at least one load-lock chamber 21 (the load-lock chamber 21b in the illustrated example) in the load-lock module 20.

It should be noted that the embodiments of the present disclosure are illustrative in all respects and are not restrictive. The above-described embodiments may be omitted, replaced, or changed in various forms without departing from the scope of the appended claims and the gist thereof.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

The invention claimed is:

1. A substrate processing apparatus, comprising:
one or more substrate processing modules;
a vacuum transfer module connected to the one or more substrate processing modules;
a load-lock module including at least three load-lock chambers arranged along a first horizontal direction;
a tubular fitting module disposed between the vacuum transfer module and the load-lock module, the tubular fitting module having a first opening and a second opening, the first opening being connected to the load-lock module, the second opening being connected to the vacuum transfer module, the first opening having a first length in the first horizontal direction, the second opening having a second length in the first horizontal direction, the first length being larger than the second length; and
a transfer mechanism disposed in the vacuum transfer module, the transfer mechanism being configured to transfer a substrate between the one or more substrate processing modules and the load-lock module through the tubular fitting module, wherein
the tubular fitting module includes
a gas supply port connected to an inert gas supply source, and
an exhaust port connected to an exhaust mechanism,
the exhaust mechanism includes a turbo molecular pump, and the turbo molecular pump is connected to the exhaust port through a connection line,
the tubular fitting module has a third length in a second horizontal direction orthogonal to the first horizontal direction,
a diameter of the connection line is smaller than the third length, and
a height dimension of the tubular fitting module is smaller than a height dimension of the vacuum transfer module, and a total length of the connection line is greater than a difference between the height dimension of the tubular fitting module and the height dimension of the vacuum transfer module.

2. The substrate processing apparatus of claim 1, wherein the tubular fitting module has an inner space communicating with the first opening and the second opening, and the inner space of the tubular fitting module communicates with an inner space of the vacuum transfer module through the second opening.

3. The substrate processing apparatus of claim 2, wherein the load-lock module includes at least three gate valves respectively corresponding to the at least three load-lock chambers, and the at least three gate valves are configured to open and close transfer ports formed at corresponding load-lock chambers.

4. The substrate processing apparatus of claim 3, wherein the first opening of the tubular fitting module has a dimension that covers at least three transfer ports of the transfer ports formed to respectively correspond to the at least three load-lock chambers.

5. The substrate processing apparatus of claim 2, wherein
the vacuum transfer module has two openings at both ends in the second horizontal direction orthogonal to the first horizontal direction,
wherein one opening of the two openings communicates with the tubular fitting module, and
the other opening of the two openings is closed by a plate.

6. The substrate processing apparatus of claim 2, wherein the one or more substrate processing modules include a plasma processing module, and
the transfer mechanism is configured to further transfer an edge ring used in the plasma processing module.

7. The substrate processing apparatus of claim 1, wherein the load-lock module includes at least three gate valves respectively corresponding to the at least three load-lock chambers, and the at least three gate valves are configured to open and close transfer ports formed at corresponding load-lock chambers.

8. The substrate processing apparatus of claim 7, wherein the first opening of the tubular fitting module has a dimension that covers at least three transfer ports of the transfer ports formed to respectively correspond to the at least three load-lock chambers.

9. The substrate processing apparatus of claim 1, wherein the vacuum transfer module has two openings at both ends in the second horizontal direction orthogonal to the first horizontal direction,
wherein one opening of the two openings communicates with the tubular fitting module, and
the other opening of the two openings is closed by a plate.

10. The substrate processing apparatus of claim 1, wherein the one or more substrate processing modules include a plasma processing module, and
the transfer mechanism is configured to further transfer an edge ring used in the plasma processing module.

11. The substrate processing apparatus of claim 10, wherein the edge ring is disposed in at least one of the at least three load-lock chambers.

12. A substrate processing apparatus, comprising:
one or more substrate processing modules;
a vacuum transfer module connected to the one or more substrate processing modules;
a load-lock module including at least three load-lock chambers arranged along a first horizontal direction;

a tubular fitting module disposed between the vacuum transfer module and the load-lock module, the tubular fitting module having a first opening and a second opening, the first opening being connected to the load-lock module, the second opening being connected to the vacuum transfer module, the first opening having a first length in the first horizontal direction, the second opening having a second length in the first horizontal direction, the first length being larger than the second length; and a transfer mechanism disposed in the vacuum transfer module, the transfer mechanism being configured to transfer a substrate between the one or more substrate processing modules and the load-lock module through the tubular fitting module, wherein the tubular fitting module includes an exhaust port connected to an exhaust mechanism, the exhaust mechanism includes a turbo molecular pump, and the turbo molecular pump is connected to the exhaust port through a connection line, a height dimension of the tubular fitting module is smaller than a height dimension of the vacuum transfer module, and a total length of the connection line is greater than a difference between the height dimension of the tubular fitting module and the height dimension of the vacuum transfer module.

* * * * *